United States Patent
Toyoda

(10) Patent No.: US 10,224,509 B2
(45) Date of Patent: Mar. 5, 2019

(54) DISPLAY DEVICE

(71) Applicant: Japan Display Inc., Minato-ku (JP)

(72) Inventor: Hironori Toyoda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/657,954

(22) Filed: Jul. 24, 2017

(65) Prior Publication Data

US 2018/0062114 A1   Mar. 1, 2018

(30) Foreign Application Priority Data

Sep. 1, 2016   (JP) ................ 2016-171169

(51) Int. Cl.
*H01L 27/32* (2006.01)
*H01L 51/50* (2006.01)
*H01L 51/52* (2006.01)

(52) U.S. Cl.
CPC ...... *H01L 51/5259* (2013.01); *H01L 51/5012* (2013.01); *H01L 51/5218* (2013.01); *H01L 27/3244* (2013.01); *H01L 51/5234* (2013.01); *H01L 51/5271* (2013.01); *H01L 2251/301* (2013.01); *H01L 2251/5315* (2013.01)

(58) Field of Classification Search
None
See application file for complete search history.

(56) References Cited

U.S. PATENT DOCUMENTS

| 2015/0287770 A1 | 10/2015 | Sato |
| 2015/0352521 A1* | 12/2015 | Lee ................ B01J 20/28016 257/40 |
| 2016/0111474 A1* | 4/2016 | Sato ................ H01L 51/5271 257/40 |

FOREIGN PATENT DOCUMENTS

| JP | 2015-201354 | 11/2015 |
| KR | 10-2014-0051782 A | 5/2014 |
| KR | 10-2016-0068336 A | 6/2016 |

OTHER PUBLICATIONS

Office Action dated Aug. 13, 2018 in Korean Patent Application No. 10-2017-0095301 with English translation, 8 pages.
Office Action dated Oct. 22, 2018 in Korean Application No. 10-2017-0095301 (w/English translation).

* cited by examiner

*Primary Examiner* — Shaun M Campbell
(74) *Attorney, Agent, or Firm* — Oblon, McClelland, Maier & Neustadt, L.L.P.

(57) ABSTRACT

A display device includes a light emitting device layer including a light emitting layer, a light-transmissive upper electrode on the light emitting device layer, a lower electrode having light transmittance and moisture permeability under the light emitting device layer, a light reflection layer under the lower electrode, and a hygroscopic layer having a hygroscopic property between the lower electrode and the light reflection layer.

7 Claims, 6 Drawing Sheets

DISPLAY DEVICE

CROSS-REFERENCE TO RELATED APPLICATION

The present application claims priority from Japanese application JP2016-171169 filed on Sep. 1, 2016, the content of which is hereby incorporated by reference into this application.

BACKGROUND OF THE INVENTION

1. Field of the Invention
This invention relates to a display device.
2. Description of the Related Art
In development of an organic electroluminescence display device, the inventors et al. evaluated a test device and found that end portions were darker in a light emission area in 2 mm×2 mm of a display area. As a result of further research, it was known that it was highly likely that deterioration of light emitting devices due to moisture was the cause.

In related art, measures for trapping moisture by providing a hygroscopic material under a lower electrode are taken (JP 2015-201354 A). However, it is hard to completely block moisture by the hygroscopic material and avoid the deterioration of the light emitting devices. The partial luminance difference due to the deterioration of the light emitting device is recognized as uneven display, and measures therefor are demanded.

SUMMARY OF THE INVENTION

An object of the invention is to effectively remove moisture.

A display device according to the invention includes a light emitting device layer including a light emitting layer, a light-transmissive upper electrode on the light emitting device layer, a lower electrode having light transmittance and moisture permeability under the light emitting device layer, a light reflection layer under the lower electrode, and a hygroscopic layer having a hygroscopic property between the lower electrode and the light reflection layer.

According to the invention, the hygroscopic layer is provided under the lower electrode having moisture permeability, and moisture may be effectively removed. Particularly, the hygroscopic layer is formed using a material having a property that light transmittance rises with absorption of moisture, and thereby, the layer may compensate for deterioration of device characteristics caused by moisture.

DETAILED DESCRIPTION OF THE INVENTION

Figure 1:
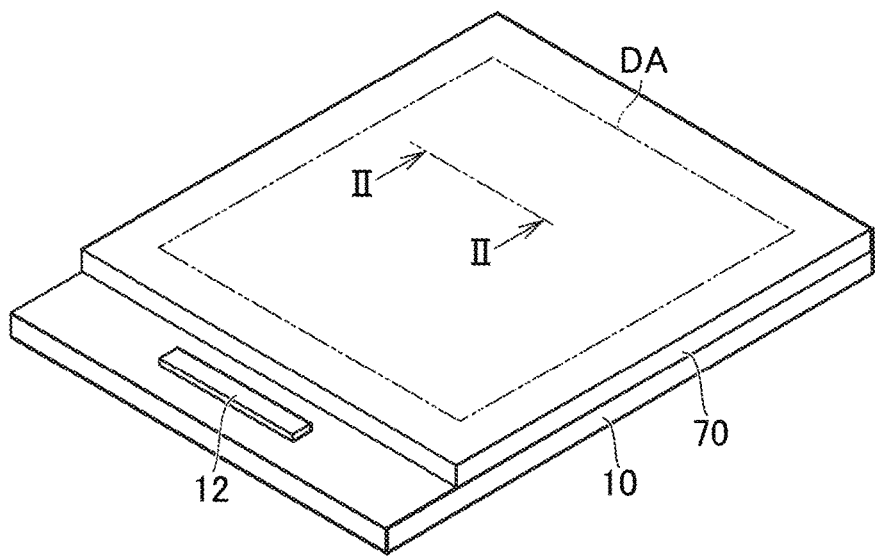
FIG. 1 is a perspective view of a display device according to the first embodiment of the invention.

As below, embodiments of the invention will be explained with reference to the drawings. Note that the invention may be embodied in various forms without departing from the scope of the invention and should not be limited to the interpretation of the description of the embodiments to be exemplified.

In the drawings, for clearer explanation, widths, thicknesses, shapes, etc. of respective parts may be schematically shown compared to the actual forms, however, they are just examples and do not limit the interpretation of the invention. In the specification and drawings, elements having the same functions described with respect to the previously mentioned drawings may have the same signs, and the overlapping explanation may be omitted.

Further, in the detailed description of the invention, when a position relationship between a certain configuration and another configuration is defined, "on" or "under" includes not only the case where the other configuration is located directly on or directly underneath but also the case where yet another configuration intervenes unless otherwise noted.

[First Embodiment]

FIG. 1 is a perspective view of a display device according to the first embodiment of the invention. As the display device, an organic electroluminescence display device is taken as an example. The display device is adapted to form full-color pixels by combining unit pixels (sub-pixels) of a plurality of colors e.g. red, green, and blue and display full-color images. The display device has a first substrate 10. The first substrate 10 has a display area DA in which a plurality of pixels are arranged in a matrix form. On the first substrate 10, an integrated circuit chip 12 for driving elements for displaying images is mounted, and a flexible print board (not shown) may be connected for external electrical connection.

Figure 2:
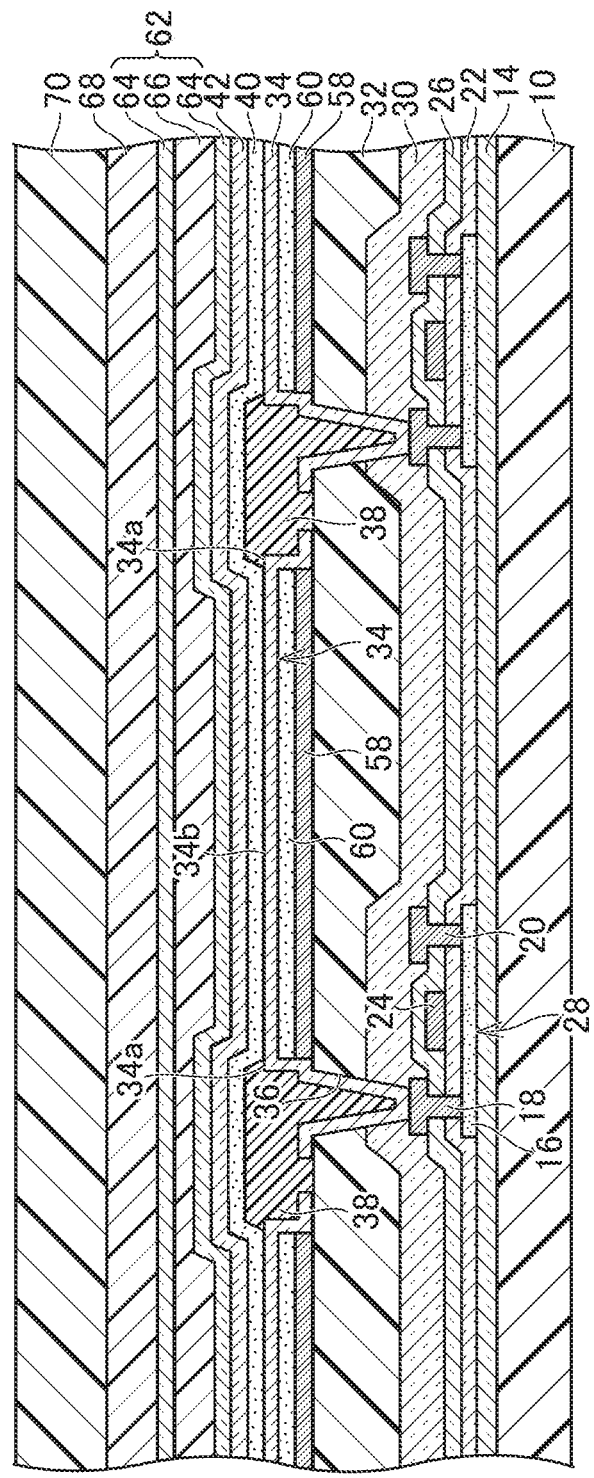
FIG. 2 is a partially enlarged view of a section along line II-II of the display device shown in FIG. 1.

FIG. 2 is a partially enlarged view of a section along line II-II of the display device shown in FIG. 1. The first substrate 10 is made of a resin or glass and may be a film having flexibility of polyimide, polyethylene terephthalate, or the like. On the first substrate 10, an undercoat layer 14 that serves as a barrier to an impurity contained in itself is formed. The undercoat layer 14 includes a silicon oxide film or silicon nitride film and may be a stacked structure of the films. A semiconductor layer 16 is formed on the undercoat layer 14. Source electrodes 18 and drain electrodes 20 are electrically connected to the semiconductor layer 16 and a gate insulating film 22 is formed to cover the semiconductor layer 16. A gate electrode 24 is formed on the gate insulating film 22 and an interlayer insulating film 26 is formed to cover the gate electrode 24. The source electrodes 18 and the drain electrodes 20 penetrate the gate insulating film 22 and the interlayer insulating film 26. The semiconductor layer 16, the source electrode 18, the drain electrode 20, and the gate electrode 24 form a thin-film transistor 28. A passivation film 30 is provided to cover the thin-film transistors 28.

A planarizing layer 32 is formed on the passivation film 30. On the planarizing layer 32, a plurality of lower electrodes 34 (pixel electrodes, e.g. anodes) adapted to respectively correspond to a plurality of unit pixels (sub-pixels) are provided. The lower electrode 34 is made of ITO (Indium Tin Oxide) or IZO (Indium Zinc Oxide) and has light transmittance. Further, the lower electrode 34 has a thickness with moisture permeability (e.g. 10 nm or less). The planarizing layer 32 is formed so that at least a surface on which the lower electrodes 34 are provided may be flat. As the planarizing layer 32, an organic material such as a light-sensitive acrylic resin is often used. The lower electrode 34 is electrically connected to one of the source electrode 18 and the drain electrode 20 on the semiconductor layer 16 by a contact hole 36 penetrating the planarizing layer 32 and the passivation film 30.

Insulating layers 38 are formed on the planarizing layer 32 and the lower electrodes 34. The insulating layer 38 is formed on a peripheral edge portion 34a of the lower electrode 34 to avoid superimposition on a center portion 34b of the lower electrode 34. A bank surrounding a part of the lower electrode 34 is formed by the insulating layer 38.

A light emitting device layer 40 is provided on the lower electrodes 34. On the light emitting device layer 40, an upper electrode 42 (common electrode, e.g. cathode) is provided. The upper electrode 42 is made of ITO (Indium Tin Oxide) or IZO (Indium Zinc Oxide) and has light transmittance. The upper electrode 42 lies on the insulating layers 38 as the banks. The light emitting device layer 40 is sandwiched by the lower electrodes 34 and the upper electrode 42, and has luminance controlled by a current flowing between the layers and emits light.

Figure 3:
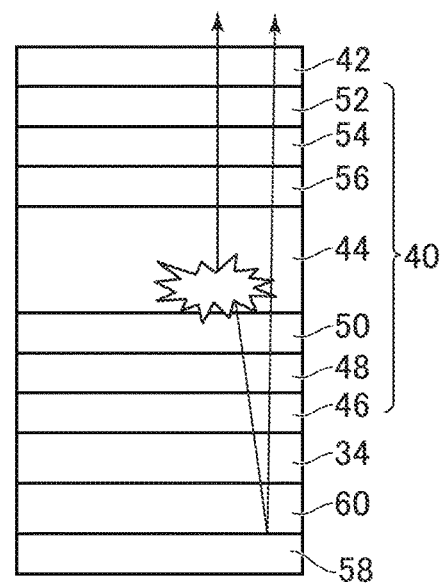
FIG. 3 is an enlarged view of a light emitting device layer.

FIG. 3 is an enlarged view of the light emitting device layer. The light emitting device layer 40 includes a light emitting layer 44. The light emitting device layer 40 includes a hole injection layer 46, a hole transport layer 48, and an electron blocking layer 50 sequentially stacked in a direction toward the light emitting layer 44 (upward direction) on the lower electrodes 34. The light emitting device layer 40 includes an electron injection layer 52 (e.g. Ca), an electron transport layer 54, and a hole blocking layer 56 sequentially stacked in a direction toward the light emitting layer 44 (downward direction) under the upper electrode 42.

The light emitting device layer 40 is formed on the entire surface covering the display area DA (see FIG. 1) over the plurality of pixels. That is, the light emitting device layer 40 is continuous on the insulating layers 38. In this case, the light emitting device layer 40 is formed by coating using solvent dispersion. When the light emitting layer 44 is formed over the plurality of pixels, a configuration of emitting lights in white in all sub-pixels and extracting desired color wavelength portions through color filters (not shown) is obtained. Note that the light emitting layer 44 may be individually (separately) provided for each lower electrode 34. In this case, the light emitting layers 44 emit lights in blue, red, or green in correspondence with the respective pixels. The colors corresponding to the respective pixels are not limited to those, but may be e.g. yellow, white, or the like. The individualized light emitting layers 44 are formed by e.g. evaporation.

A light reflection layer 58 made of e.g. a metal is provided below the lower electrodes 34. The light generated in the light emitting layer 44 is reflected by the light reflection layer 58. A hygroscopic layer 60 having a hygroscopic property intervenes between the lower electrode 34 and the light reflection layer 58. The hygroscopic layer 60 is made of e.g. a material containing Ca and has a property that light transmittance rises with absorption of moisture. The hygroscopic layer 60 is provided to be continuously superimposed on a region from the center portion 34b to the peripheral portion 34a of the lower electrode 34.

According to the embodiment, the hygroscopic layer 60 is provided under the lower electrodes 34 having moisture permeability, and moisture may be effectively removed. Particularly, the hygroscopic layer 60 is formed using a material having a property that light transmittance rises with absorption of moisture, and thereby, may compensate for deterioration of the device characteristics caused by moisture. Specifically, as expressed by a chemical formula $Ca+2H_2O \rightarrow Ca(OH)_2+H_2\uparrow$, Ca reacts with water and calcium hydroxide is produced. The calcium hydroxide has higher light transmittance than Ca. Therefore, even when the light emission efficiency is lower due to moisture, in the part, the deterioration of the device characteristics may be compensated for because of the higher light transmittance and uneven display may be relaxed. Ca is also used for the material of the electron injection layer 52, and thereby, cost rise may be suppressed. Note that Mg, Sr, or Ba may be used besides Ca.

The light emitting device layer 40 is covered and sealed by a sealing layer 62 stacked on the upper electrode 42 and blocked from moisture. The sealing layer 62 may have a stacked structure including at least one inorganic insulating layer 64 made of SiN or the like. For example, the sealing layer 62 may have a structure in which at least one organic insulating layer 66 made of a resin or the like is sandwiched between a pair of inorganic insulating layers 64. The sealing layer 62 covers the display area DA (see FIG. 1). A second substrate 70 is attached to the sealing layer 62 via an adhesive layer 68. The second substrate 70 is made of a resin or glass and may be a film having flexibility of polyimide, polyethylene terephthalate, or the like.

[Second Embodiment]

Figure 4:
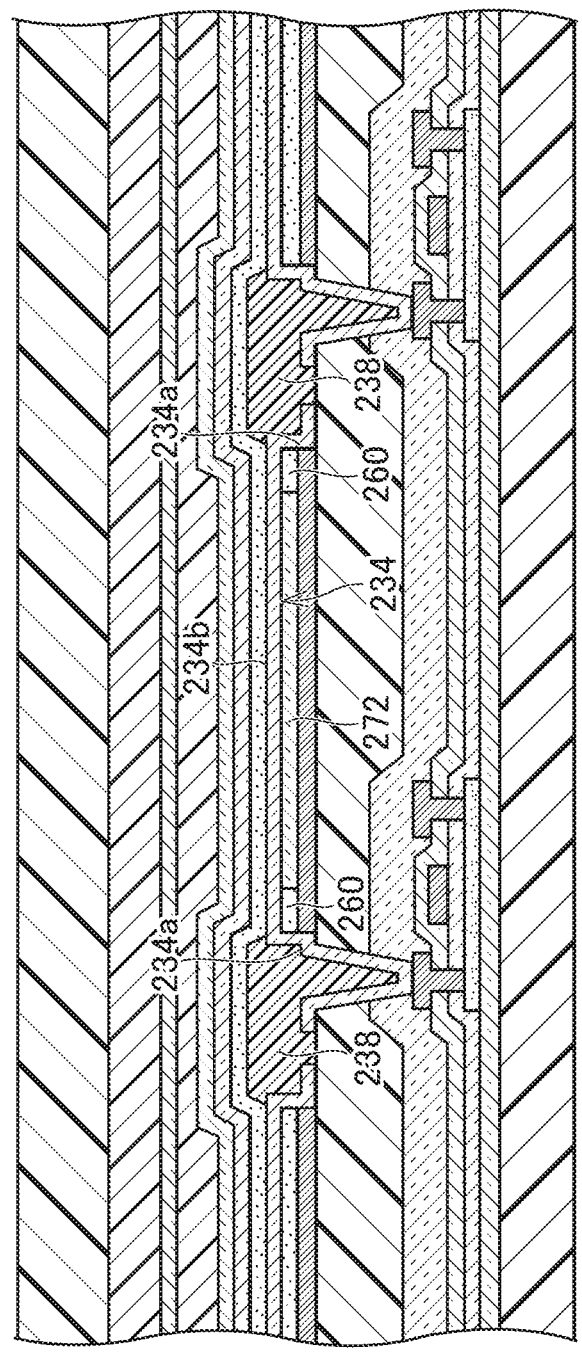
FIG. 4 is a sectional view of a display device according to the second embodiment of the invention.

FIG. 4 is a sectional view of a display device according to the second embodiment of the invention. In the embodiment, a hygroscopic layer 260 is provided to be superimposed on a peripheral edge portion 234a of a lower electrode 234, but to avoid superimposition on a center portion 234b of the lower electrode 234. Further, the hygroscopic layer 260 is provided to protrude from the superimposition area on an insulating layer 238 in a direction toward the center portion 234b. Under the center portion 234b on which the superimposition is avoided by the hygroscopic layer 260, a light transmissive conducting layer 272 made of ITO (Indium Tin Oxide) or IZO (Indium Zinc Oxide) is provided. According to the embodiment, the light transmissive conducting layer 272 is located directly beneath the center portion 234b of the lower electrode 234, and thereby, higher light transmittance may be secured.

[Third Embodiment]

Figure 5:
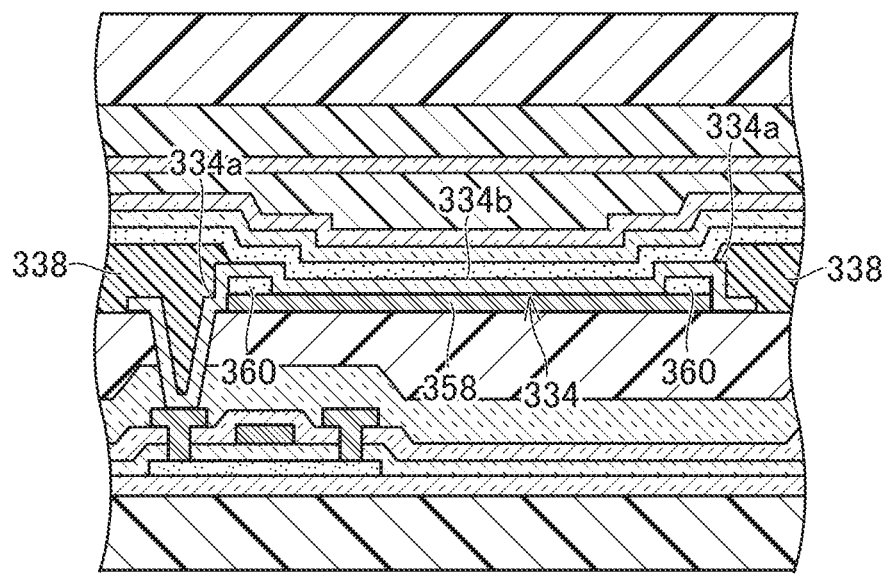
FIG. 5 is a sectional view of a display device according to the third embodiment of the invention.

FIG. 5 is a sectional view of a display device according to the third embodiment of the invention. In the embodiment, a hygroscopic layer 360 is provided to be superimposed on a peripheral edge portion 334a of a lower electrode 334, but to avoid superimposition on a center portion 334b of the lower electrode 334. Further, the hygroscopic layer 360 is provided to protrude from the superimposition area on an insulating layer 338 in a direction toward the center portion 334b. The lower electrode 334 is continuously stacked on the surfaces of a light reflection layer 358 and the hygroscopic layer 360. According to the embodiment, the embodiment is different from the second embodiment in that there is no light transmissive conducting layer directly beneath the center portion 334b of the lower electrode 334.

[Fourth Embodiment]

Figure 6:
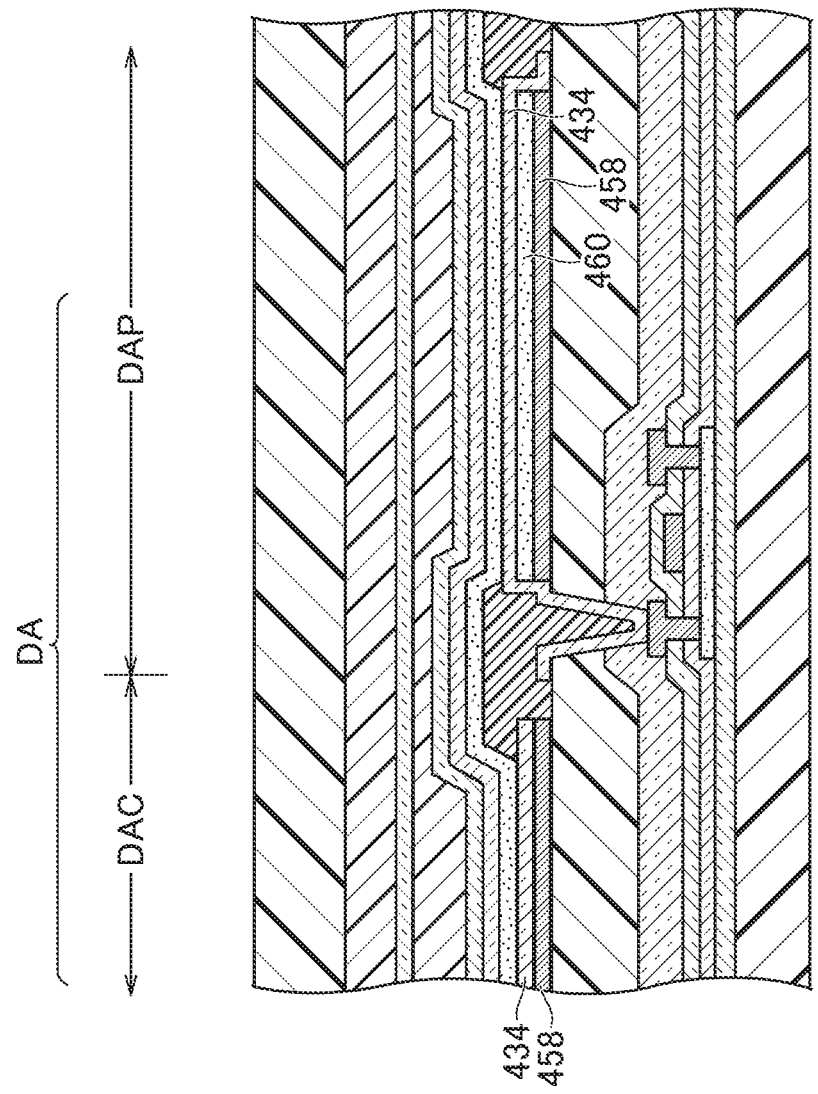
FIG. 6 is a sectional view of a display device according to the fourth embodiment of the invention.

FIG. 6 is a sectional view of a display device according to the fourth embodiment of the invention. A plurality of lower electrodes 434 are arranged in a display area DA. In the display area DA, a hygroscopic layer 460 is provided below the lower electrodes 434 in a peripheral edge area DAP thereof. On the other hand, in the display area DA, in a center area DAC thereof, the hygroscopic layer 460 is not provided below the lower electrodes 434. Note that a light reflection layer 458 is provided below the lower electrodes 434 in both the center area DAC and the peripheral edge area DAP of the display area DA. According to the embodiment, in the center area DAC of the display area DA, higher light transmittance is secured because of absence of the hygroscopic layer 460 and, in the peripheral edge area DAP susceptible to moisture, the hygroscopic layer 460 compensates for the deterioration of the device characteristics caused by moisture.

Note that the display device is not limited to the organic electroluminescence display device, but may be a display device including light emitting devices such as quantum-dot light emitting diodes (QLEDs) in respective pixels.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a light emitting device layer including a light emitting layer;
    a light-transmissive upper electrode on the light emitting device layer;
    a lower electrode having light transmittance and moisture permeability under the light emitting device layer;
    a light reflection layer under the lower electrode;
    a hygroscopic layer having a hygroscopic property located between the lower electrode and the light reflection layer; and
    an insulating layer formed on a peripheral edge portion of the lower electrode without superimposition on a center portion of the lower electrode,
    wherein the hygroscopic layer is provided to be superimposed on the peripheral edge portion without superimposition on the center portion of the lower electrode.

2. The display device according to claim 1, wherein the hygroscopic layer has a property that light transmittance rises with absorption of moisture.

3. The display device according to claim 2, wherein the hygroscopic layer is made of a material containing calcium.

4. A display device comprising:
    a light emitting device layer including a light emitting layer;
    a light-transmissive upper electrode on the light emitting device layer;
    a lower electrode having light transmittance and moisture permeability under the light emitting device layer;
    a light reflection layer under the lower electrode; and
    a hygroscopic layer having a hygroscopic property located between the lower electrode and the light reflection layer,
    wherein the lower electrode includes a plurality of lower electrodes arranged in a display area, and
    the hygroscopic layer is provided below the lower electrodes located in a peripheral edge area of the display area but not below the lower electrodes located in a center area of the display area.

5. The display device according to claim 1, wherein the hygroscopic layer is provided to protrude from a superimposition area on the insulating layer in a direction toward the center portion.

6. The display device according to claim 1, further comprising a light transmissive conducting layer under the center portion on which superimposition is avoided by the hygroscopic layer.

7. The display device according to claim 4, further comprising an insulating layer formed on a peripheral edge portion of the lower electrode without superimposition on a center portion of the lower electrode,
    wherein the hygroscopic layer is provided to be continuously superimposed on a region from the center portion to the peripheral edge portion.

* * * * *